(12) United States Patent
Nakamura et al.

(10) Patent No.: US 8,006,030 B2
(45) Date of Patent: Aug. 23, 2011

(54) MEMORY CONTROLLER FOR IDENTIFYING THE LAST VALID PAGE/SEGMENT IN A PHYSICAL BLOCK OF A FLASH MEMORY

(75) Inventors: Seiji Nakamura, Osaka (JP); Hirokazu Sou, Osaka (JP)

(73) Assignee: Panasonic Corporation, Osaka (JP)

( * ) Notice: Subject to any disclaimer, the term of this patent is extended or adjusted under 35 U.S.C. 154(b) by 723 days.

(21) Appl. No.: 11/667,477

(22) PCT Filed: Sep. 20, 2006

(86) PCT No.: PCT/JP2006/318597
§ 371 (c)(1),
(2), (4) Date: May 10, 2007

(87) PCT Pub. No.: WO2007/119267
PCT Pub. Date: Oct. 25, 2007

(65) Prior Publication Data
US 2009/0228634 A1      Sep. 10, 2009

(30) Foreign Application Priority Data
Mar. 13, 2006    (JP) .................................. 2006-067385

(51) Int. Cl.
*G06F 13/00* (2006.01)
(52) U.S. Cl. ........................ 711/103; 711/156; 714/6.11
(58) Field of Classification Search ........................ None
See application file for complete search history.

(56) References Cited

U.S. PATENT DOCUMENTS

| | | | |
|---|---|---|---|
| 5,519,831 A | 5/1996 | Holzhammer | |
| 6,678,785 B2* | 1/2004 | Lasser | 711/103 |
| 6,988,175 B2* | 1/2006 | Lasser | 711/156 |
| 7,003,532 B2* | 2/2006 | Bradshaw | 707/202 |
| 7,240,178 B2* | 7/2007 | Nakada et al. | 711/203 |
| 2002/0026607 A1 | 2/2002 | Takahashi et al. | |
| 2003/0189860 A1 | 10/2003 | Takeuchi et al. | |
| 2006/0218339 A1 | 9/2006 | Fischer et al. | |
| 2008/0104361 A1* | 5/2008 | Ippongi | 711/206 |
| 2009/0019321 A1* | 1/2009 | Radke | 714/54 |

FOREIGN PATENT DOCUMENTS

DE    103 22 723 B3    10/2004
(Continued)

OTHER PUBLICATIONS

Extended European Search Report issued in European Patent Application No. EP 06798153.0-2210/2003569 PCT/JP2006318597, dated Mar. 20, 2009.

*Primary Examiner* — Hetul Patel
(74) *Attorney, Agent, or Firm* — McDermott Will & Emery LLP

(57) ABSTRACT

Data is written in data areas (202) and information for correcting an error of the data and status information indicating that the data has been written are written in redundant areas (203) sequentially from the first page of a physical block (201). In the step of creating information to be written in the physical block (201), the redundant areas (203) of the pages are subjected to a binary search to temporarily identify a last valid page. Further, the contents of every area (the data areas and the redundant areas) of the temporarily identified last valid page and a page adjacent to the temporarily identified last valid page are checked to finally identify the last valid page and make a judgment as to whether or not an error page resulting from power-down exists.

12 Claims, 8 Drawing Sheets

FOREIGN PATENT DOCUMENTS

| | | |
|---|---|---|
| GB | 2 256 735 A | 12/1992 |
| JP | 2002-73425 A | 3/2002 |
| JP | 2003-15929 A | 1/2003 |
| WO | WO 03/030180 A1 | 4/2003 |
| WO | WO 2004/021191 A1 | 3/2004 |

* cited by examiner

MEMORY CONTROLLER FOR IDENTIFYING THE LAST VALID PAGE/SEGMENT IN A PHYSICAL BLOCK OF A FLASH MEMORY

RELATED APPLICATIONS

This application is the U.S. National Phase under 35 U.S.C. §371 of International Application No. PCT/JP2006/318597, filed on Sep. 20, 2006, which in turn claims the benefit of Japanese Application No. 2006-067385, filed on Mar. 13, 2006, the disclosures of which Applications are incorporated by reference herein.

TECHNICAL FIELD

The present invention relates to an art of controlling access to nonvolatile semiconductor memories. In particular, it relates to a memory controller for controlling access to flash memories requiring sequential write.

BACKGROUND ART

The size of the market for nonvolatile semiconductor memories has been increasing. Flash memories are one of semiconductor memories utilizing floating gate transistors to achieve nonvolatility of data.

In a conventional flash memory, data erasure is performed on a physical block basis, the physical block including a plurality of pages, and reading and writing of data are performed page by page. Even if a random write request is received, data write operation is controlled such that data is written in all erased pages of the physical block sequentially from the first page. To such a flash memory, sequential write access is controlled in accordance with mapping from logical (virtual) pages to physical pages. Each of the pages includes a data area for storing data and a redundant area for storing data management information. The redundant area of each page stores a logical page number (address) associated with data written in the data area of the same page (see Patent Publication 1) as data management information.

According to another conventional technique, when it is requested to rewrite or additionally write the pages in a single physical block of a flash memory which requires sequential write, new page data is written in a new erased physical block sequentially from the first page, and then data previously written in the pages of the physical block before updating is transferred to the rest of the pages in the new physical block. A page offset, which is the difference between the logical page number and the physical page number, is stored in the redundant areas of the flash memory. Data management information contained in the redundant areas of the pages includes a logical address corresponding to the physical page to which it belongs, a flag indicating whether or not the page is blank, a flag indicating whether the data written in the page is enabled or disabled and information for detecting an error of the data. The correspondence between the logical block address and the physical block address is controlled by an address conversion table (see Patent Publication 2).

Patent Publication 1: International Patent Publication No. 2003/030180 (pamphlet)

Patent Publication 2: International Patent Publication No. 2004/021191 (pamphlet)

DISCLOSURE OF THE INVENTION

Problem that the Invention is to Solve

When power-down occurs during data writing (programming) into a flash memory, data corruption occurs in a page in which the data is being written. In order to control access to a flash memory requiring sequential write, what are required are information as to whether or not an error page resulting from the power-down exists and an address of a last valid page in the physical block. The last valid page is a page which is written most recently among the pages in the physical block and does not include any uncorrectable error.

In order to obtain the address of the last valid page of the physical block and judge whether or not the uncorrectable error exists, it is necessary to search through the physical block. However, it takes a long time if the search is performed by reading data from the data areas and the redundant areas on a page-by-page basis sequentially from the first page. As the number of pages included in a single physical block is increasing in these days, the search is becoming time-consuming.

With respect to a memory controller for controlling access to a flash memory requiring sequential write, an object of the present invention is to identify a last valid page and make a judgment as to whether or not an error page resulting from the power-down exists in a quick and accurate manner.

Means of Solving the Problem

In order to achieve the object, according to the present invention, binary search is performed on the redundant areas of the pages to temporarily identify a last valid page. Then, the contents of every area (data areas and redundant areas) of the temporarily identified last valid page and a page adjacent thereto are checked to finally identify the last valid page and make a judgment as to whether or not an error page resulting from the power-down exists.

More specifically, the present invention relates to a memory controller for controlling access to a flash memory having a physical block including a plurality of pages, each of the pages having a data area for storing data and a redundant area for storing data management information. The memory controller includes: a page write unit for writing data in the data areas and writing information for correcting an error of the data and status information indicating that the data has been written as the data management information in the redundant areas sequentially from the first page of all erased pages of the physical block; a binary search unit for reading the status information in the redundant areas of the pages through a binary search to temporarily identify a last valid page; and a last valid data identification unit for reading the data from the data areas and the data management information from the redundant areas of the last valid page temporarily identified by the binary search unit and a page adjacent to the temporarily identified last valid page to finally identify the last valid page and make a judgment as to whether an error page resulting from power-down during the operation of the page write unit exists or not based on the results of checking each page as to whether or not an uncorrectable error has occurred and whether or not the data has been written in the data area.

With respect to a flash memory having a physical unit including a plurality of physical blocks, to which data is written segment by segment including a predetermined number of pages, a memory controller for the flash memory may include: a page write unit for writing data in the data areas and writing information for correcting an error of the data and status information indicating that the data has been written as the data management information in the redundant areas sequentially on a segment-by-segment basis from the first segment of all erased segments of the physical unit, each of the segments including a predetermined number of pages of the physical block; a binary search unit for reading the status information in the redundant areas of the first pages of the segments through a binary search to temporarily identify a last valid segment; and a last valid data identification unit for reading the data from the data areas and the data management information from the redundant areas of every page belonging to the last valid segment temporarily identified by the binary search unit and every page belonging to a segment adjacent to the temporarily identified last valid page to finally identify the last valid segment and make a judgment as to whether an error segment resulting from power-down during the operation of the page write unit exists or not based on the results of checking each segment as to whether or not an uncorrectable error has occurred and whether or not the data has been written in the data areas.

Effect of the Invention

According to the present invention, with respect to a flash memory in which data writing is performed page by page, the identification of a true last valid page and the judgment as to whether or not an error page resulting from the power-down exists are carried out in a quick and accurate manner. Further, with respect to a flash memory in which data writing is performed segment by segment, the identification of a true last valid segment and the judgment as to whether or not an error segment resulting from the power-down exists are achieved in a quick and accurate manner.

EXPLANATION OF REFERENCE NUMERALS

Figure 1:
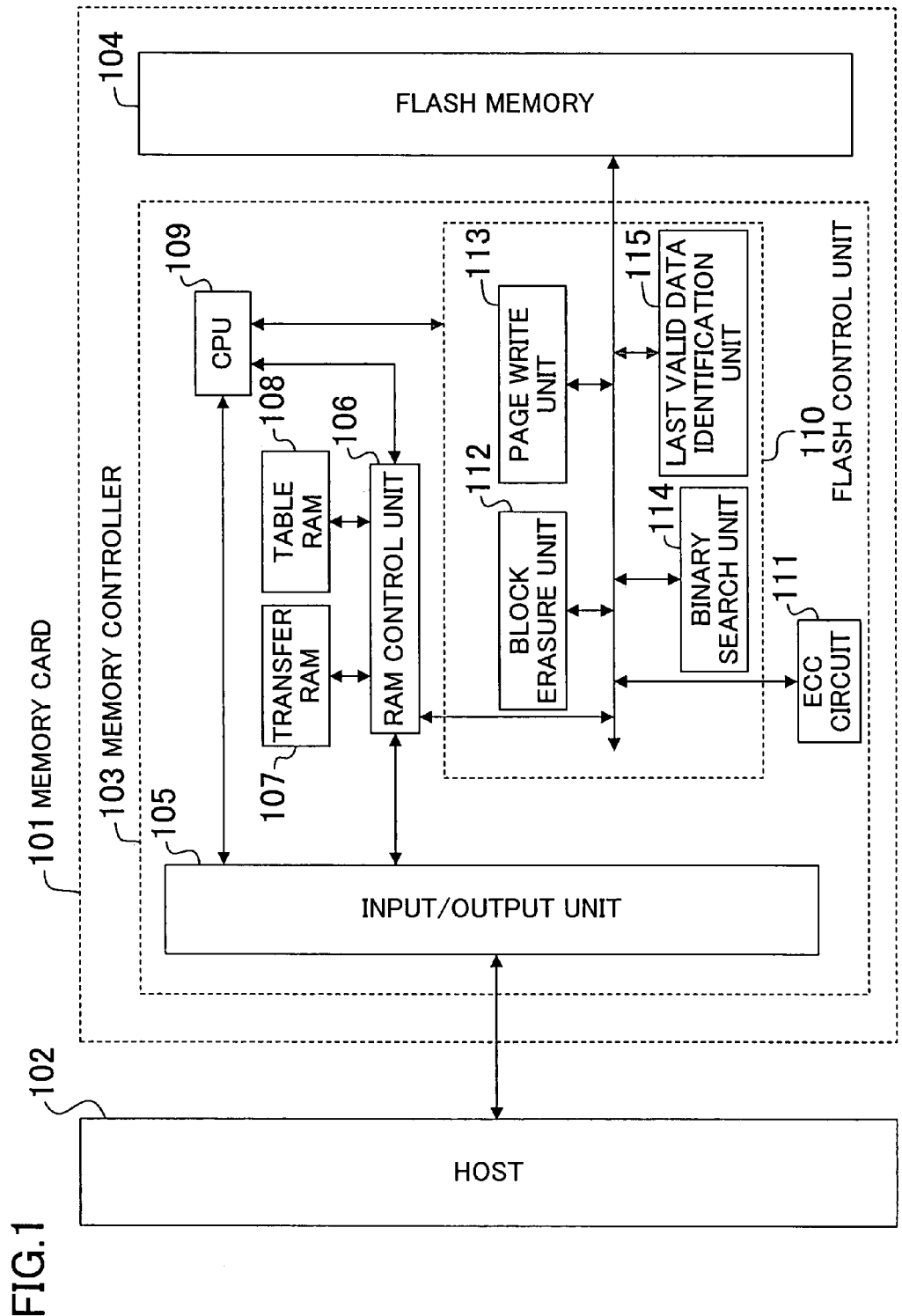
FIG. 1 is a block diagram illustrating an example of the configuration of a system including a memory card provided with a memory controller and a flash memory according to the present invention.

101 Memory card
102 Host
103 Memory controller
104 Flash memory
105 Input/Output unit
106 RAM control unit
107 Transfer RAM
108 Table RAM
109 CPU
110 Flash control unit
111 ECC circuit
112 Block erasure unit
113 Page write unit
114 Binary search unit
115 Last valid data identification unit
201 Physical block
202 Data area
203 Redundant area
601 Physical unit

BEST MODE FOR CARRYING OUT THE INVENTION

Hereinafter, explanation of embodiments of the present invention is provided with reference to the attached drawings.

FIG. 1 illustrates an example of the configuration of a system including a memory card provided with a memory controller and a flash memory according to the present invention. The system of FIG. 1 is a nonvolatile memory system including a memory card 101 which is one of nonvolatile memory devices and a host 102 which requests access to the memory card 101. The host 102 may be a cellular phone, a digital still camera, a personal computer or a portable digital music player. The nonvolatile memory device is not limited to those in the form of a card such as the memory card 101 as long as it is used as a recording medium for the host 102.

In this embodiment, the host 102 is a cellular phone provided with a slot into which the memory card 101 is inserted. The memory card 101 is inserted into the slot of the host 102 to communicate with the host 102. The communication between the memory card 101 and the host 102 is that of a master-slave type with the host 102 serving as the master and the memory card 101 as the slave.

The memory card 101 includes a memory controller 103 and a flash memory 104, access to which is controlled by the memory controller 103. The flash memory 104 may be a NAND flash memory requiring sequential write as described above. It may be a binary flash memory in which a single memory cell has one of two values 0 and 1, or a multivalued flash memory in which a single memory cell has one of four values 00, 01, 10 and 11. The memory controller 103 and the flash memory 104 may be configured as individual LSI chips, respectively, or may be integrated into a single LSI chip.

The memory controller 103 includes an input/output unit 105, a RAM (random access memory) control unit 106, a transfer RAM 107, a table RAM 108, a CPU (central processing unit) 109, a flash control unit 110 and an ECC (error correcting code) circuit 111.

The input/output unit 105 receives command signals and data signals sent from the host 102 and transmits response signals and data signals to the host 102. Upon receiving a data signal from the host 102, the input/output unit 105 transfers the data signal to the transfer RAM 107 to temporarily store the signal therein and outputs an interrupt signal to the CPU 109. To send the data to the host 102, the data stored in the transfer RAM 107 is output to the host 102.

The RAM control unit 106 performs switching between access to the transfer RAM 107 and access to the table RAM 108 based on the setting of the CPU 109. Based on the setting of the RAM control unit 106, the CPU 109 and the flash control unit 110 are allowed to access both of the transfer RAM 107 and the table RAM 108; The input/output unit 105 is able to access the transfer RAM 107.

The transfer RAM 107 temporarily stores data transferred from the host 102 and data that the flash control unit 110 read out of the flash memory 104. The table RAM 108 stores write information of the flash memory 104. The write information is information about the status of usage of the physical block (whether it has been written or virgin), an address conversion table indicating the correspondence between a logical address and a physical address and an address of a last valid page in the physical block during writing, etc. The information stored in the table RAM 108 is created when the flash control unit 110 accesses the flash memory 104 during the initialization period before reading/writing data from/in the memory card 101 after the memory card 101 is turned on and updated when data from the host 102 is received after the initialization or an erase command is received. For example, the information as to whether or not the physical block is virgin is easily created by reading the first page of the physical block to check whether the data has been written or not.

The CPU 109 reads/writes data from/in the transfer RAM 107 and the table RAM 108 via the RAM control unit 106. If the command signal and the data signal are not sent from the host 102 for a certain period, blocks other than an interrupt control unit in the CPU 109 are suspended until an interrupt signal is sent from the input/output unit 105, thereby assisting power saving function. In order that the CPU 109 accesses the flash memory 104, a certain operation command is sent to the flash control unit 110 to achieve the access. The operation command may be a command to erase data from the physical block, a command to write data in pages of the physical block, a command to read data out of the redundant areas through a binary search and a command to read data out of every area of the pages to identify a last valid page and make a judgment as to whether or not power-down has occurred, etc.

The flash control unit 110 includes a block erasure unit 112, a page write unit 113, a binary search unit 114 and a last valid data identification unit 115. The units 112 to 115 operate in response to a command from the CPU 109 to access the flash memory 104 for the purpose of reading, writing and erasing. The block erasure unit 112 erases data from a specified physical block of the flash memory 104. The page write unit 113 reads data from the transfer RAM 107, adds a syndrome for error correction thereto and write the data in a predetermined page of the physical block. In this step, the syndrome for error correction is written in the redundant area of the predetermined page and a mark "Low" indicating that the data has been written is placed in a bit corresponding to the write status information in the redundant area. In the step of creating data of the table RAM 108 during the initialization, the binary search unit 114 reads data out of the redundant areas of the target physical block through a binary search to temporarily identify a last valid page (details are described later). The binary search unit 114 may read only the write status information in the redundant areas. The last valid data identification unit 115 reads the contents of every area of a predetermined page in the physical block and stores the data in the transfer RAM 107 via the ECC circuit 111. Then, based on whether or not an uncorrectable error has occurred, the last valid page is finally identified and a judgment is made as to whether or not the power-down has occurred (details are described later).

The ECC circuit 111 generates a syndrome for error correction with respect to data written in the flash memory 104 and performs detection and correction of error with respect to data read out of the flash memory 104. When the ECC circuit 111 detects an uncorrectable error, an uncorrectable error signal is issued by the ECC circuit 111. If the ECC circuit 111 detects an uncorrectable error in the data read out of a certain page, it means that the page is an error page where the power-down has occurred.

Figure 2:
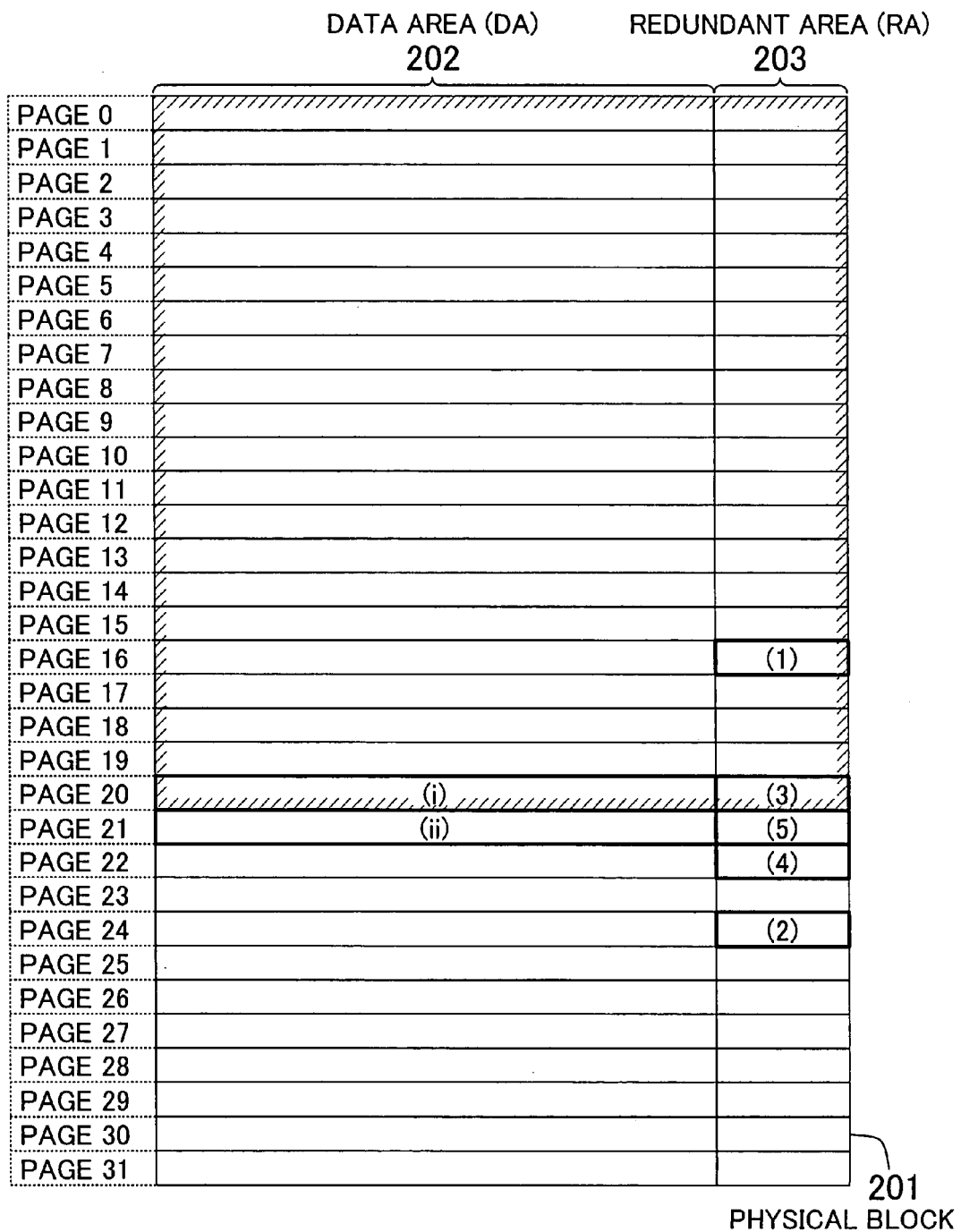
FIG. 2 is a conceptual diagram illustrating the internal configuration of the flash memory shown in FIG. 1.

FIG. 2 shows an example of the internal configuration of the flash memory 104 shown in FIG. 1. While the flash memory 104 of FIG. 1 includes a plurality of physical blocks, FIG. 2 shows only a single physical block 201 for explanation purpose. The physical block 201 shown in FIG. 2 is consisted of 32 physical pages including page 0 to page 31. For example, each of the pages includes a data area (DA) 202 of 512 bytes and a redundant area (RA) 203 of 16 bytes. The data area 202 is mainly used to store data transferred from the host 102. The redundant area 203 is used to store data management information such an ECC syndrome, page offset and status information indicating that the data has been written.

As to the physical block 201 shown in FIG. 2, it is supposed that data is always sequentially written from the first page. Hatching shown in FIG. 2 indicates that data has been written in pages 0 to 20. In each page, data writing shall not be performed twice (e.g., after data is written in the data area 202, data is not written in the redundant area 203 at a different timing).

Figure 3:
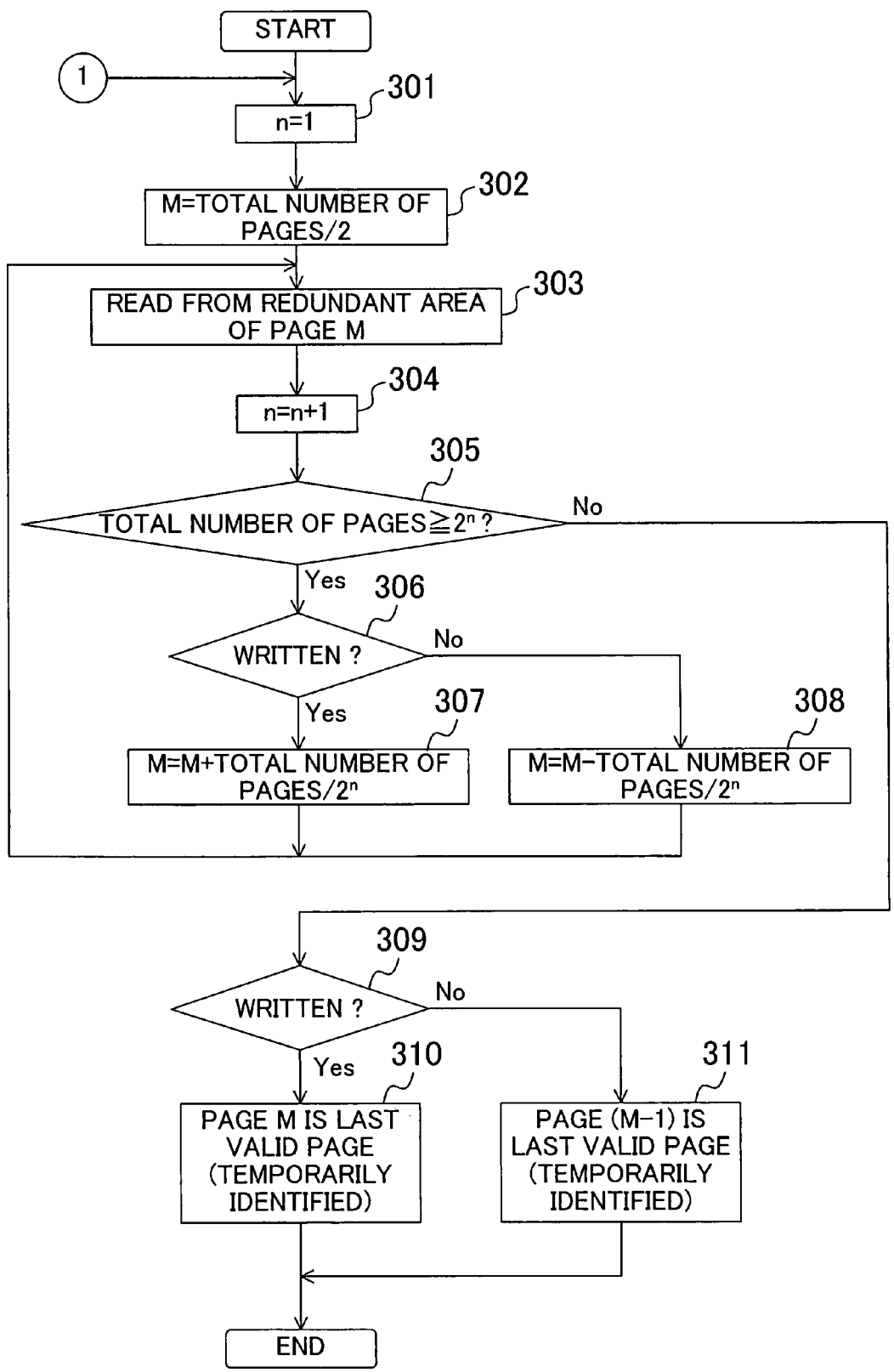
FIG. 3 is a flowchart of the operation of a binary search unit shown in FIG. 1 with the configuration of FIG. 2 adopted thereto.

FIG. 3 shows the operation of the binary search unit 114 shown in FIG. 1 with the configuration of FIG. 2 adopted thereto. As to the physical block 201 to be searched for the last valid page, it is supposed that data is always written at least in page 0.

Referring to FIG. 3, variable n representing the number of readings is set to 1 in step 301. Further, in step 302, variable M representing an address of a page to be read is set to a value "the total number of pages of the physical block $201/2$". Then, the redundant area 203 of page M is read in step 303. Based on the write status information in the data management information read out of the redundant area 203 of page M, a judgment is made as to whether or not data has been written. If the bit of the write status information is "Low", it means that the data has been written. If it is "High", it means that the data has not been written.

In step 304, variable n is incremented by 1. Then, in step 305, a judgment is made as to whether or not "the total number of pages of the physical block $201 \geq 2^{n}$" is met. The step 305 is a termination condition for a loop operation from step 303 to step 307 or 308 to be described later.

If "Yes" is selected in step 305, the flow proceeds to step 306. If it is found in step 306 that the status information read in step 303 indicates that the data has been written, the flow proceeds to step 307. In step 307, variable M is increased by "the total number of pages of the physical block $201/2^{n}$". Alternatively, if it is found in step 306 that the status information read in step 303 indicates that the data has not been written, the flow proceeds to step 308. In step 308, variable M is decreased by "the total number of pages of the physical block $201/2^{n}$". After step 307 or 308, the flow returns to step 303 to repeat the processing.

If "No" is selected in step 305, the flow proceeds to step 309. If it is found in step 309 that the status information read in step 303 indicates that the data has been written, the flow proceeds to step 310. In step 310, page M is temporarily identified as a last valid page. Alternatively, if it is found in step 309 that the status information read in step 303 indicates that the data has not been written, the flow proceeds to step 311. In step 311, page (M−1) is temporarily identified as a last valid page.

With respect to the physical block 201 shown in FIG. 2, data is read from the redundant areas 203 of (1) page 16, (2) page 24, (3) page 20, (4) page 22 and (5) page 21 in this order and page 20 is temporarily identified as the last valid page.

Figure 4:
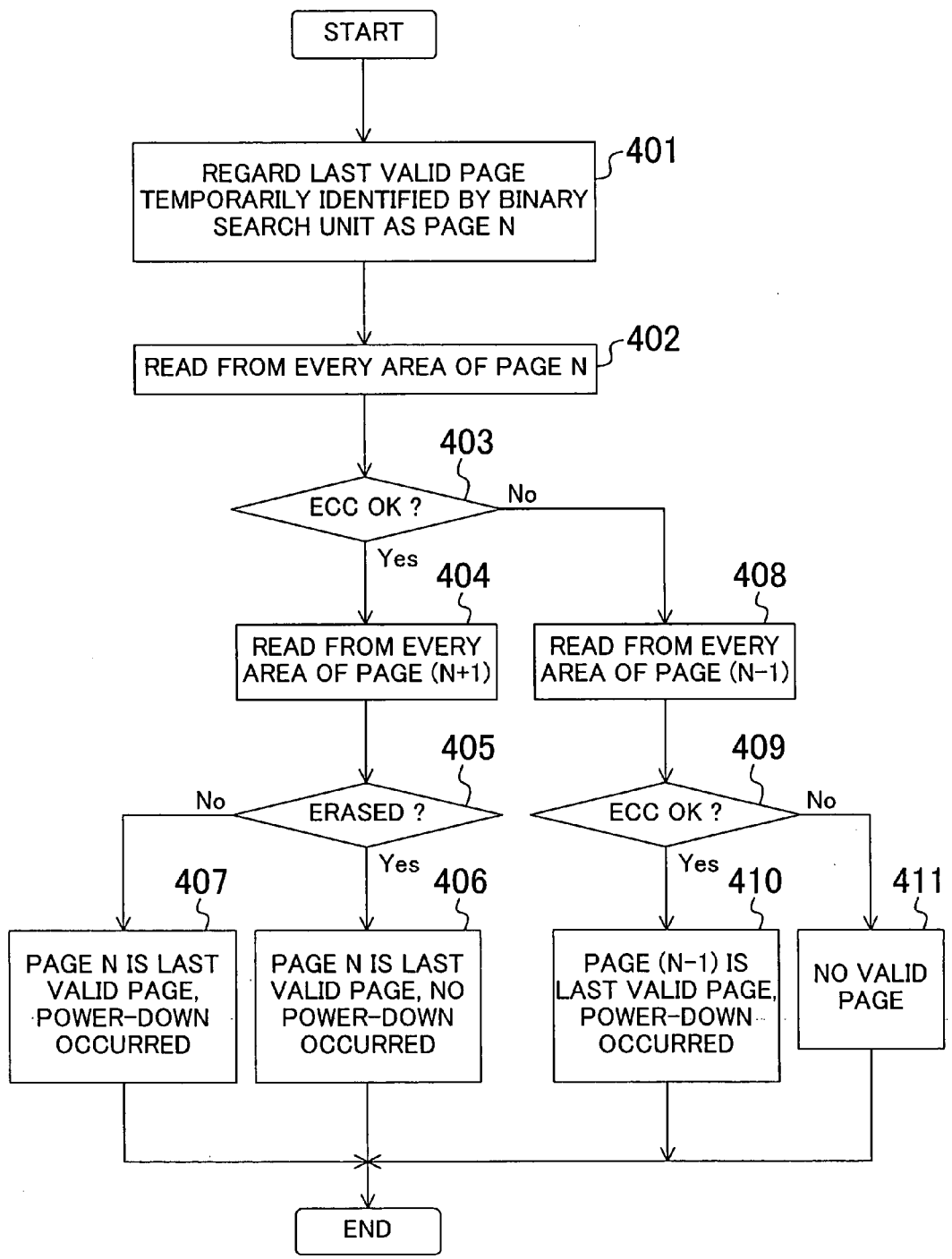
FIG. 4 is a flowchart of the operation of a last valid data identification unit shown in FIG. 1 with the configuration of FIG. 2 adopted thereto.

FIG. 4 shows the operation of the last valid data identification unit 115 of FIG. 1 with the configuration of FIG. 2 adopted thereto. In this case, it is assumed that the temporary identification of the last valid page by the binary search unit 114 has already been done.

Referring to FIG. 4, in step 401, the last valid page temporarily identified by the binary search unit 114 is regarded as page N. In the following step 402, the contents of every area (the data area 202 and the redundant area 203) of page N are read and temporarily stored in the transfer RAM 107 via the ECC circuit 111. Then, in step 403, a judgment is made as to whether or not an uncorrectable error has occurred in page N. If it is judged that the uncorrectable error has not occurred in page N, the flow proceeds to step 404. In step 404, data is read out of every area of page (N+1) to make a judgment as to whether or not page (N+1) is an error page. In step 405, a judgment is made as to whether or not data has been erased from (has not been written in) the data area 202 of page (N+1). If the data has been erased from page (N+1), the flow proceeds to step 406. This is the case where the physical block 201 does not include any error page resulting from the power-down. In step 406, page N is finally identified as the last valid page and it is judged that the power-down has not occurred in the physical block 201.

If it is judged in step 405 that data has been written in the data area 202 of page (N+1), the flow proceeds to step 407. In page (N+1), since the data area 202 has been written while the redundant area 203 has been erased, this is judged as an abnormal state resulting from the power-down. In step 407, page N is finally identified as the last valid page and it is judged that the power-down has occurred while the data is written in page (N+1).

If it is judged in step 403 that the uncorrectable error has occurred in page N, the flow proceeds to step 408. In page N, since the data area 202 has been written while the redundant area 203 has been erased, this is judged as an abnormal state resulting from the power-down. However, it is also necessary to make a judgment as to whether or not the uncorrectable error has occurred in page (N−1). Then, in step 408, data is read out of every area of page (N−1). Then, if it is judged in step 409 that the uncorrectable error has not occurred in page (N−1), the flow proceeds to step 410. In step 410, page (N−1) is identified as a true last valid page and it is judged that the power-down has occurred while the data is written in page N.

If it is judged in step 409 that the uncorrectable error has occurred in page (N−1), the flow proceeds to step 411. This is the case where the uncorrectable error has occurred in both of pages N and (N−1). Since this is an abnormal state and will not be caused by a single power-down, it is judged that no valid page exists in the physical block 201 and the processing is terminated.

If the physical block 201 shown in FIG. 2 does not contain any error page resulting from the power-down, page 20 is temporarily identified as the last valid page. Then, data is read out of every area (the data areas 202 and the redundant areas 203) of (i) page 20 and (ii) page 21 in this order. Thus, page 20 is finally identified as the last valid page and it is judged that the power-down has not occurred in the physical block 201.

After the identification of the last valid page, the CPU 109 updates the information of the table RAM 108. However, if the writing is performed in pages downstream of the page where the power-down has occurred, data corruption may possibly occur and data writing cannot be controlled properly. Therefore, if the uncorrectable error resulting from the power-down is detected, valid data is copied into another erased physical block before updating the information of the table RAM 108.

Figure 5:
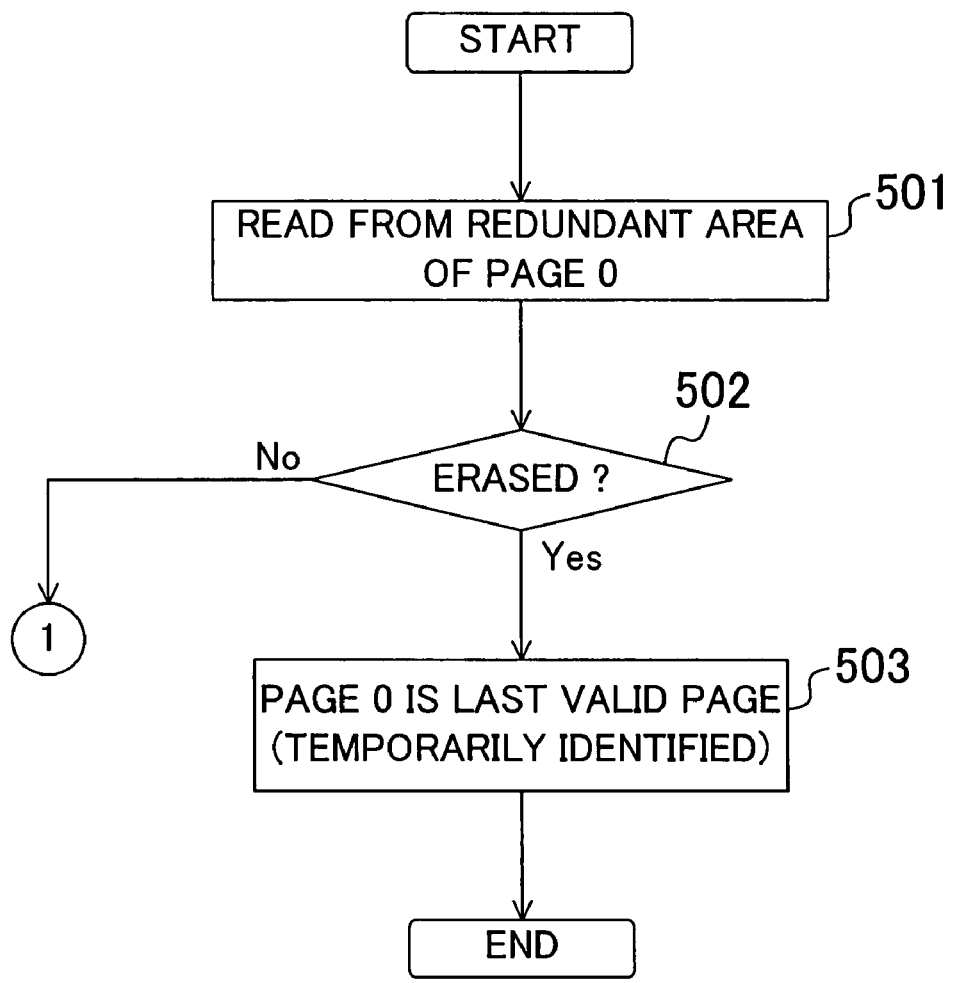
FIG. 5 is a flowchart of a modification of FIG. 3.

FIG. 5 shows the operation of the binary search unit 114 according to a modification of FIG. 3. Referring to FIG. 5, information is read out of the redundant area 203 of a first page (page 0) of the physical block 201 in step 501. Then, based on the status information read in step 501, a judgment is made in step 502 as to whether or not data has been erased from (has not been written in) page 0. If it is found in step 502 that the data has been erased, the flow proceeds to step 503, where page 0 is temporarily identified as the last valid page and the operation is terminated. After page 0 is temporarily identified as the last valid page in such a quick manner, the last valid data identification unit 115 operates as indicated in the flowchart of FIG. 4. Alternatively, if it is found in step 502 that the data has been written, the binary search unit 114 proceeds to the flow starting from step 301 shown in FIG. 3.

According to the processing shown in FIG. 5, even if there is a possibility that the physical block 201 is in the course of writing or in an erased state and the possibility of the erased state is relatively high, the identification of the last valid page and the judgment as to whether or not the error page resulting from the power-down exists are achieved in a quick and accurate manner.

Figure 6:
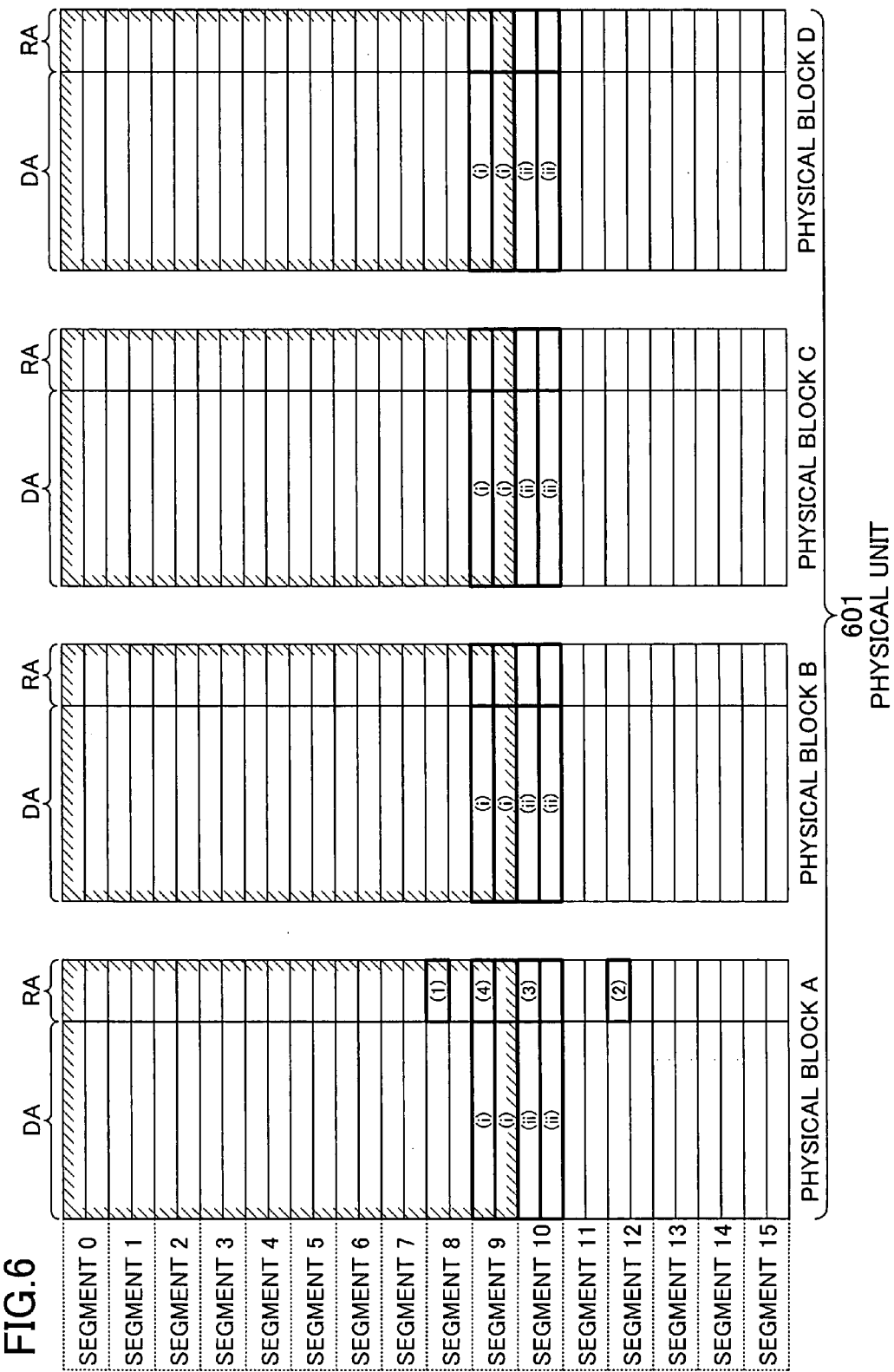
FIG. 6 is a conceptual diagram illustrating another internal configuration of the flash memory shown in FIG. 1.

FIG. 6 shows another internal configuration of the flash memory 104 shown in FIG. 1. In an example shown in FIG. 6, four physical blocks A, B, C and D constitute a single physical unit 601. Each of the physical blocks A, B, C and D contains segments made of 8 pages and data writing is performed segment by segment. The four physical blocks A, B, C and D include 128 pages, respectively. That is, the physical unit 601 of FIG. 6 includes 16 segments from segment 0 to segment 15. Each of the pages includes a data area (DA) and a redundant area (RA) just like the example shown in FIG. 2.

With respect to the physical unit 601 of FIG. 6, it is supposed that data is always sequentially written from the first segment. Hatching shown in FIG. 6 indicates that data has been written in segments 0 to 9.

The page write unit 113 of FIG. 1 operates in the following manner. Data writing into the physical unit 601 is always performed segment by segment irrespective of the byte count transferred from the host 102. Each of the segments is made of 8 pages. Write status information of each segment is stored at least in the redundant area of the first page in the segment.

More specifically, when data is transferred from the host 102, the data is first written in page 0 of the physical block A. Then, the data is sequentially written in pages 0 of the physical blocks B, C and D in this order. After the data is written in the pages 0 of the physical blocks A to D, the data is sequentially written in pages 1 of the physical blocks A, B, C and D in this order. If the data transfer from the host 102 is stopped after the data is written in page 1 of the physical block B, data having "1" in every bit is written or original data is copied into the rest of the pages.

Next, explanation of identification of a last valid segment and judgment as to whether or not an error segment resulting from power-down exists in the physical unit 601 is provided. The last valid segment is a segment which is written most recently among the segments in the physical unit 601 and does not contain any uncorrectable error.

Figure 7:
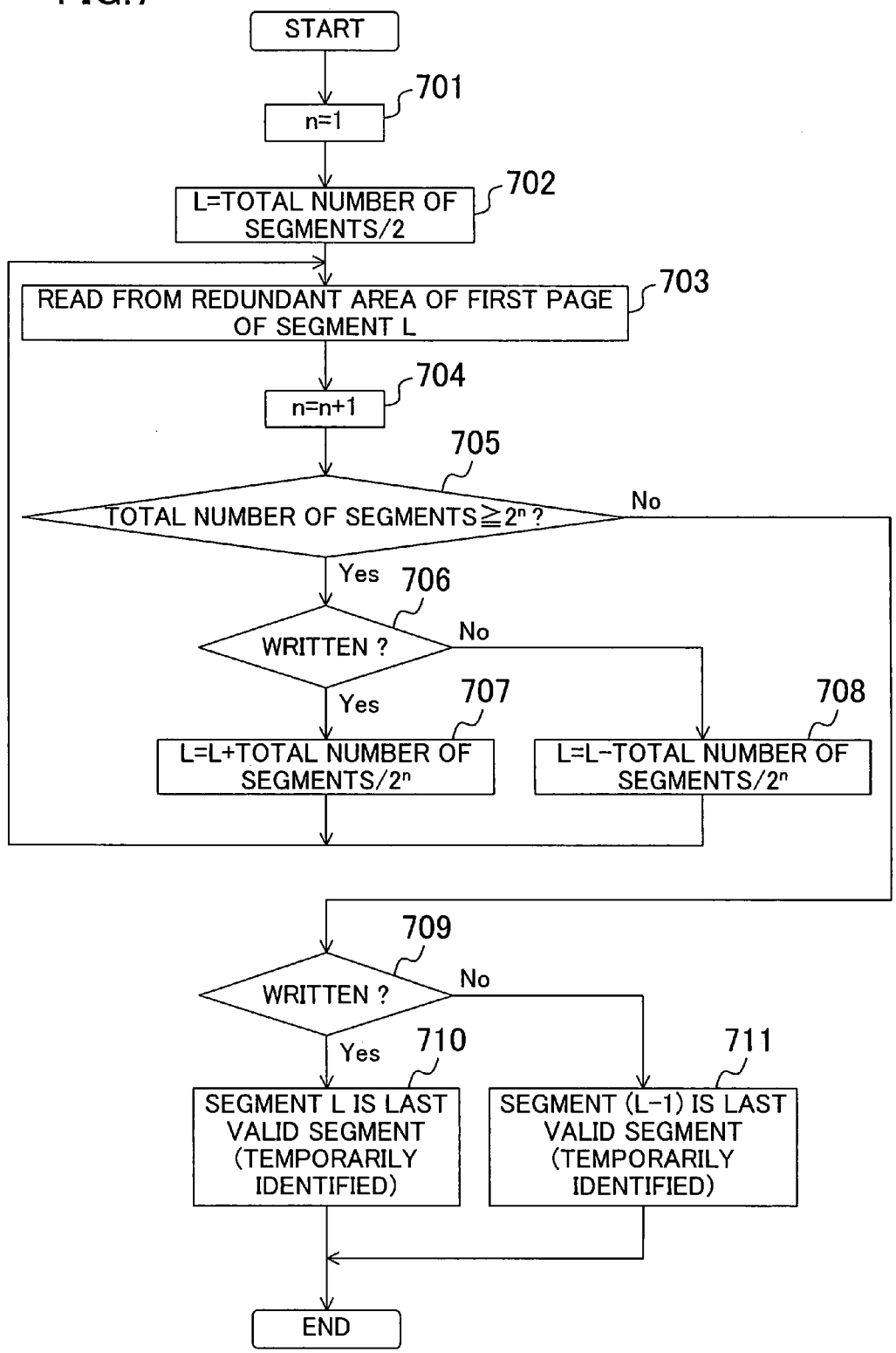
FIG. 7 is a flowchart of the operation of the binary search unit shown in FIG. 1 with the configuration of FIG. 6 adopted thereto.

FIG. 7 shows the operation of the binary search unit 114 of FIG. 1 with the configuration of FIG. 6 adopted thereto. As to the physical unit 601 to be searched for the last valid segment, it is supposed that the data is always written in at least segment 0.

Referring to FIG. 7, variable n representing the number of readings is set to 1 in step 701. Further, in step 702, variable L representing an address of a segment to be read is set to a value "the total number of segments of the physical unit 601/2". Then, the redundant area of the first page of segment L is read in step 703. Based on the write status information in the data management information read out of the redundant area of the first page of segment L, a judgment is made as to whether or not data has been written. If the bit of the write status information is "Low", it means that the data has been written. If it is "High", it means that the data has not been written.

In step 704, variable n is incremented by 1. Then, in step 705, a judgment is made as to whether or not "the total number of segments of the physical unit $601 \geq 2^{n}$" is met. The step 705 is a termination condition for a loop operation from step 703 to step 707 or 708 to be described later.

If "Yes" is selected in step 705, the flow proceeds to step 706. If it is found in step 706 that the status information read in step 703 indicates that the data has been written, the flow proceeds to step 707. In step 707, variable L is increased by "the total number of segments of the physical unit $601/2^{n}$". Alternatively, if it is found in step 706 that the status information read in step 703 indicates that the data has not been written, the flow proceeds to step 708. In step 708, variable L is decreased by "the total number of segments of the physical unit $601/2^{n}$". After step 707 or 708, the flow returns to step 703 to repeat the processing.

If "No" is selected in step 705, the flow proceeds to step 709. If it is found in step 709 that the status information read in step 703 indicates that the data has been written, the flow proceeds to step 710. In step 710, segment L is temporarily identified as a last valid segment. Alternatively, if it is found in step 709 that the status information read in step 703 indicates that the data has not been written, the flow proceeds to step 711. In step 711, segment (L−1) is temporarily identified as a last valid segment.

With respect to the physical unit 601 shown in FIG. 6, data is read from the redundant areas of the first pages of (1) segment 8, (2) segment 12, (3) segment 10 and (4) segment 9 in this order and segment 9 is temporarily identified as the last valid segment.

Figure 8:
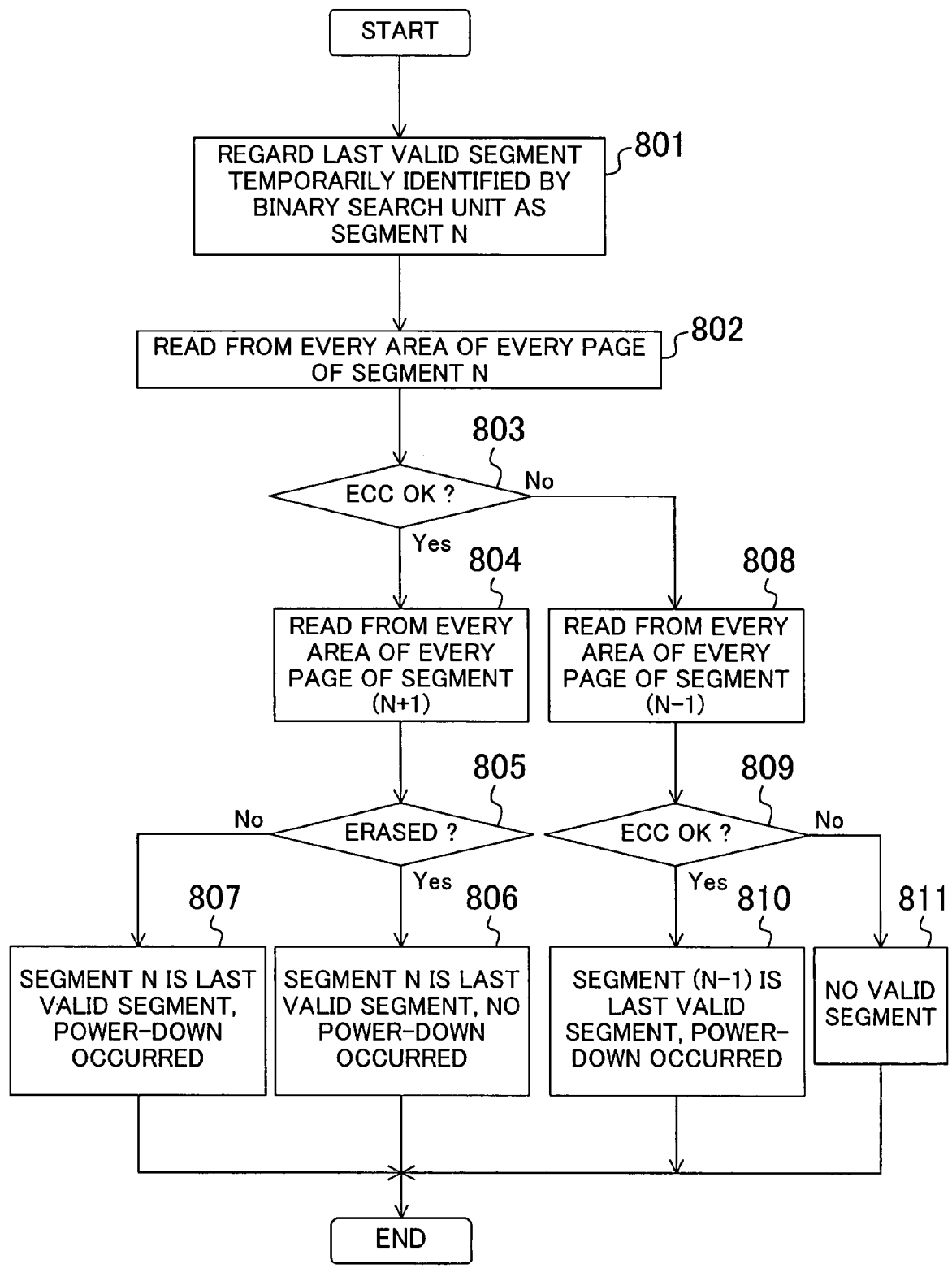
FIG. 8 is a flowchart of the operation of the last valid data identification unit shown in FIG. 1 with the configuration of FIG. 6 adopted thereto.

FIG. 8 shows the operation of the last valid data identification unit 115 of FIG. 1 with the configuration of FIG. 6 adopted thereto. In this case, it is assumed that the temporary identification of the last valid segment by the binary search unit 114 has already been done.

Referring to FIG. 8, in step 801, the last valid segment temporarily identified by the binary search unit 114 is regarded as segment N. In the following step 802, the contents of every area (the data areas and the redundant areas) of every page in segment N are sequentially read and temporarily stored in the transfer RAM 107 via the ECC circuit 111. Then, in step 803, a judgment is made as to whether or not an uncorrectable error has occurred in segment N. If it is judged that the uncorrectable error has not occurred in any page of segment N, the flow proceeds to step 804. In step 804, data is read out of every area of every page in segment (N+1) to make a judgment as to whether or not segment (N+1) is an error segment. In step 805, a judgment is made as to whether or not data has been erased from (has not been written in) the data areas of every page in segment (N+1). If it is found that the data has been erased from segment (N+1), the flow proceeds to step 806. This is the case where the physical unit 601 does not include any error segment resulting from the power-down. In step 806, segment N is finally identified as the last valid segment and it is judged that the power-down has not occurred in the physical unit 601.

If it is judged in step 805 that data has been written in the data areas of segment (N+1), the flow proceeds to step 807. In segment (N+1), since the data areas have been written while the redundant areas have been erased, this is judged as an abnormal state resulting from the power-down. In step 807, segment N is finally identified as the last valid segment and it is judged that the power-down has occurred while the data is written in segment (N+1).

If it is judged in step 803 that the uncorrectable error has occurred in segment N, the flow proceeds to step 808. In segment N, since the data areas have been written while the redundant areas have been erased, this is judged as an abnormal state resulting from the power-down. However, it is also necessary to make a judgment as to whether or not the uncorrectable error has occurred in segment (N−1). Then, in step 808, data is read out of every area of every page in segment (N−1). Then, if it is judged in step 809 that the uncorrectable error has not occurred in segment (N−1), the flow proceeds to step 810. In step 810, segment (N−1) is identified as a true last valid segment and it is judged that the power-down has occurred while the data is written in segment N.

If it is judged in step 809 that the uncorrectable error has occurred in segment (N−1), the flow proceeds to step 811. This is the case where the uncorrectable error has occurred in both of segments N and (N−1). Since this is an abnormal state and will not be caused by a single power-down, it is judged that no valid segment exists in the physical unit 601 and the processing is terminated.

If the physical unit 601 shown in FIG. 6 does not contain any error segment resulting from the power-down, segment 9 is temporarily identified as the last valid segment. Then, data is read out of every area (the data areas and the redundant areas) of every page in (i) segment 9 and (ii) segment 10 in this order. Thus, segment 9 is finally identified as the last valid segment and it is judged that the power-down has not occurred in the physical unit 601.

After the identification of the last valid segment, the CPU 109 updates the information of the table RAM 108. However, if the writing is performed in segments downstream of the segment where the power-down has occurred, data corruption may possibly occur and data writing cannot be controlled properly. Therefore, if the uncorrectable error resulting from the power-down is detected, valid data is copied into another erased physical unit before updating the information of the table RAM 108.

INDUSTRIAL APPLICABILITY

As described above, the memory controller of the present invention makes it possible to identify a last valid page or segment and make a judgment as to whether or not an error page or segment resulting from power-down exists in a quick and accurate manner. Thus, the invention is useful as a technique for controlling access to flash memories requiring sequential write.

The invention claimed is:

1. A memory controller for controlling access to a flash memory having a physical block including a plurality of pages, each of the pages having a data area for storing data and a redundant area for storing data management information, the memory controller comprising:
   a page write unit for writing data in the data areas and writing information for correcting an error of the data and status information indicating that the data has been written as the data management information in the redundant areas sequentially from the first page of all erased pages of the physical block;
   a binary search unit for reading the redundant areas of the pages through a binary search on addresses of the pages of the physical block using a means for identifying the next address of the page to read based on whether the status information in the redundant areas of the pages indicate that the data have been written or not to temporarily identify an address of the page when the binary search is finished as a last valid page; and a last valid data identification unit for reading the data from the data areas and the data management information from the redundant areas of the last valid page temporarily identified by the binary search unit and a page adjacent to the temporarily identified last valid page to finally identify the last valid page and make a judgment as to whether an error page resulting from power-down during the operation of the page write unit exists or not based on the results of checking the temporarily identified last valid page and the page adjacent to the temporarily identified last valid page as to whether or not an uncorrectable error has occurred and whether or not the data has been written in the data area.

2. The memory controller of claim 1, wherein
the binary search unit has the function of reading the status information from the first page of the physical block before the execution of the binary search for the status information to detect whether or not the first page has been erased and temporarily identifying the first page as the last valid page if the first page is detected as being erased.

3. A nonvolatile memory device comprising the memory controller of claim 1 and a flash memory, access to which is controlled by the memory controller.

4. The nonvolatile memory device of claim 3, wherein the memory controller and the flash memory are configured on a single chip.

5. A nonvolatile memory system comprising the nonvolatile memory device of claim 3 and a host which requests access to the nonvolatile memory device.

6. A memory controller for controlling access to a flash memory having a physical unit including a plurality of physical blocks, each of the physical blocks including a plurality of pages, each of the pages having a data area for storing data and a redundant area for storing data management information, the memory controller comprising:
a page write unit for writing data in the data areas and writing information for correcting an error of the data and status information indicating that the data has been written as the data management information in the redundant areas sequentially on a segment-by-segment basis from the first segment of all erased segments of the physical unit, each of the segments including a predetermined number of pages of the physical block;
a binary search unit for reading the redundant areas of the first pages of the segments through a binary search on addresses of the segments of the physical block using a means for identifying the next address of the segment to read based on whether the status information in the redundant areas of the first pages of the segments indicate that the data have been written or not to temporarily identify an address of the segment when the binary search is finished as a last valid segment; and
a last valid data identification unit for reading the data from the data areas and the data management information from the redundant areas of every page belonging to the last valid segment temporarily identified by the binary search unit and every page belonging to a segment adjacent to the temporarily identified last valid segment to finally identify the last valid segment and make a judgment as to whether an error segment resulting from power-down during the operation of the page write unit exists or not based on the results of checking the temporarily identified last valid segment and the segment adjacent to the temporarily identified last valid segment as to whether or not an uncorrectable error has occurred and whether or not the data has been written in the data areas.

7. Nonvolatile memory device comprising the memory controller of claim 6 and a flash memory, access to which is controlled by the memory controller.

8. The nonvolatile memory device of claim 7, wherein the memory controller and the flash memory are configured on a single chip.

9. A nonvolatile memory system comprising the nonvolatile memory device of claim 7 and a host which requests access to the nonvolatile memory device.

10. A method for controlling access to a flash memory having a physical block including a plurality of pages, each of the pages having a data area for storing data and a redundant area for storing data management information, the method comprising:
a page write step of writing data in the data areas and writing information for correcting an error of the data and status information indicating that the data has been written as the data management information in the redundant areas sequentially from the first page of all erased pages of the physical block;
a binary search step of reading the redundant areas of the pages through a binary search on addresses of the pages of the physical block using a means for identifying the next address of the page to read based on whether the status information in the redundant areas of the pages indicate that the data have been written or not to temporarily identify an address of the page when the binary search is finished as a last valid page; and
a last valid data identification step of reading the data from the data areas and the data management information from the redundant areas of the last valid page temporarily identified by the binary search step and a page adjacent to the temporarily identified last valid page to finally identify the last valid page and make a judgment as to whether an error page resulting from power-down during the page write step exists or not based on the results of checking the temporarily identified last valid page and the page adjacent to the temporarily identified last valid page as to whether or not an uncorrectable error has occurred and whether or not the data has been written in the data area.

11. The method of claim 10, wherein
the binary search step includes a step of reading the status information from the first page of the physical block before the execution of the binary search for the status information to detect whether or not the first page has been erased and temporarily identifying the first page as the last valid page if the first page is detected as being erased.

12. A method for controlling access to a flash memory having a physical unit including a plurality of physical blocks, each of the physical blocks including a plurality of pages, each of the pages having a data area for storing data and a redundant area for storing data management information, the method comprising:
a page write step of writing data in the data areas and writing information for correcting an error of the data and status information indicating that the data has been written as the data management information in the redundant areas sequentially on a segment-by-segment basis from the first segment of all erased segments of the physical unit, each of the segments including a predetermined number of pages of the physical block;
a binary search step of reading the redundant areas of the first pages of the segments through a binary search on addresses of the segments of the physical block using a means for identifying the next address of the segment to read based on whether the status information in the redundant areas of the first pages of the segments indicate that the data have been written or not to temporarily identify an address of the segment when the binary search is finished as a last valid segment; and
a last valid data identification step of reading the data from the data areas and the data management information from the redundant areas of every page belonging to the last valid segment temporarily identified by the binary search unit and every page belonging to a segment adjacent to the temporarily identified last valid segment to finally identify the last valid segment and make a judgment as to whether an error segment resulting from power-down during the operation of the page write unit exists or not based on the results of checking the temporarily identified last valid segment and the segment adjacent to the temporarily identified last valid segment as to whether or not an uncorrectable error has occurred and whether or not the data has been written in the data areas.

* * * * *